United States Patent [19]
Wang et al.

[11] Patent Number: 6,088,395
[45] Date of Patent: Jul. 11, 2000

[54] COMPRESSING/DECOMPRESSING APPARATUS AND METHOD TO COMPRESS AND DECOMPRESS A VIDEO GRAPHICS SIGNAL

[75] Inventors: Chi-Hui Wang, Taichung; Shang-Tzu Ju, Chungli, both of Taiwan

[73] Assignee: Winbond Electronics Corp., Hsinchu, Taiwan

[21] Appl. No.: 08/969,602

[22] Filed: Nov. 13, 1997

[30] Foreign Application Priority Data

Sep. 23, 1997 [TW] Taiwan ................................. 86113807

[51] Int. Cl.$^7$ .............................. H04N 7/12; H04N 11/02; H04N 11/04
[52] U.S. Cl. ............................ 375/240; 348/390; 348/394
[58] Field of Search ..................................... 348/391, 599, 348/600, 394, 390; 345/155, 202; 382/232, 233; H04N 7/12, 11/02, 11/04

[56] References Cited

U.S. PATENT DOCUMENTS

| | | | |
|---|---|---|---|
| 4,754,487 | 6/1988 | Newmuis ................................. | 382/118 |
| 5,469,190 | 11/1995 | Masterson ............................... | 345/155 |
| 5,696,710 | 12/1997 | Hague et al. ............................ | 708/551 |
| 5,699,079 | 12/1997 | Gosset ..................................... | 345/155 |
| 5,844,608 | 12/1998 | Yu et al. ................................. | 348/390 |

*Primary Examiner*—Howard Britton
*Assistant Examiner*—Nhon T Diep
*Attorney, Agent, or Firm*—Ladas & Parry

[57] ABSTRACT

A compressing/decompressing apparatus comprising a receiver, a memory interface, a compressor and a decompressor is disclosed. The receiver receives a video graphics signal comprising a plurality of video graphics packets, each comprising a plurality of pixels. The memory interface is coupled between the frame buffer memory and the compressing and decompressing device as a data transfer interface. The compressor sequentially receives a video graphics packet of the video graphics signal, truncates a predetermined length of LSBs of each pixel in the video graphics packet to form a compressed video graphics signal comprising of a plurality of compressed video graphics packets, and stores the compressed video graphics signal in a frame buffer memory. The decompressor sequentially receives a compressed video graphics packet of the compressed video graphics signal, recovers each pixel of the compressed video graphics packet with an adjusted value of the predetermined length to form a decompressed video graphics signal comprising of a plurality of decompressed video graphics packets.

18 Claims, 4 Drawing Sheets

COMPRESSING/DECOMPRESSING APPARATUS AND METHOD TO COMPRESS AND DECOMPRESS A VIDEO GRAPHICS SIGNAL

FIELD OF THE INVENTION

The present invention relates in general to a compressing/decompressing apparatus and method, and in particular, to a compressing/decompressing apparatus and method for compressing and decompressing a video graphics signal, which can effectively reduce the size of a frame buffer memory and the cost of applicable video systems.

BACKGROUND OF THE INVENTION

Current digital video systems usually provides a frame buffer memory for storing the video graphics signal to be displayed. The video graphics signal generally comes from decompressed video through either broadcasting or networking schemes. This frame buffer memory is essential since it is impractical to decompress and display the same data at the same time. If the video resolution gets higher, that is, the data size is increased in a great amount, a large frame buffer memory is required and the hardware cost will increase.

Conventional methods of overcoming the large memory requirement are to down-sample the decompressed graphics signal then interpolate in output end. For example, horizontal sub-sample one of every two pixels will halve the required memory space. These kind of methods of using interpolation process will blur the output images and therefore degrade the resolution performance. The same result takes place if vertical rather than horizontal sub-sampling is used.

Consequently, one object of the present invention is to provide a compressing/decompressing apparatus and method for compressing and decompressing a video graphics signal in a video system having a frame buffer memory and a display. The apparatus can effectively reduces the memory size while preserves high video resolution of the output images.

Besides, in the compressing/decompressing apparatus of the present invention, a predictor is used to provide an adjusted value for compensating the compressed pixel and therefore improves video resolution of the output images.

SUMMARY OF THE INVENTION

The present invention is to provide a compressing/decompressing apparatus which includes a receiver, a memory interface, a compressor and a decompressor, wherein the receiver receives a video graphics signal including a sequence of video graphics packets, each having a fixed number of pixels. The memory interface, positioned between the frame buffer memory and the compressor and the decompressor, is a data transfer interface. The compressor sequentially receives a video graphics packet of the video graphics signal, truncates a predetermined length of LSBs of each pixel in the video graphics packet to form a compressed video graphics signal which includes the compressed video graphics packets thus obtained, and stores the compressed video graphics signal in a frame buffer memory. The decompressor sequentially receives a compressed video graphics packet of the compressed video graphics signal, and recovers each pixel of the compressed video graphics packet with an adjusted value of the predetermined length to form a decompressed video graphics signal which includes the decompressed video graphics packets thus obtained.

Besides, the present invention also provides a compressing/decompressing method used in a video system with a frame buffer memory and a display for compressing and decompressing a video graphics signal. The method includes the steps of: first receiving the video graphics signal composed of a sequence of video graphics packets, each having a fixed number of pixels; then, providing compressing means which is coupled to the receiving means for sequentially receiving a video graphics packet of the video graphics signal, truncating a predetermined length of LSBs of each pixel in the video graphics packet to form a compressed video graphics signal including the obtained compressed video graphics packets, and storing the compressed video graphics signal in the frame buffer memory through a memory interface; next, providing decompressing means which is coupled to the memory interface for sequentially receiving a compressed video graphics packet of the compressed signal, recovering each pixel of the compressed video graphics packet with a predicted value of the predetermined length to form a decompressed video graphics signal including the obtained decompressed video graphics packets, and outputting the decompressed video graphics signal to the display through the memory interface.

BRIEF DESCRIPTION OF THE DRAWINGS

The following detailed description, given by way of example and being not intended to limit the invention solely to the embodiments described herein, will best be understood in conjunction with the accompanying drawings, in which.

DESCRIPTION OF THE PREFERRED EMBODIMENT

First Embodiment

Figure 1:
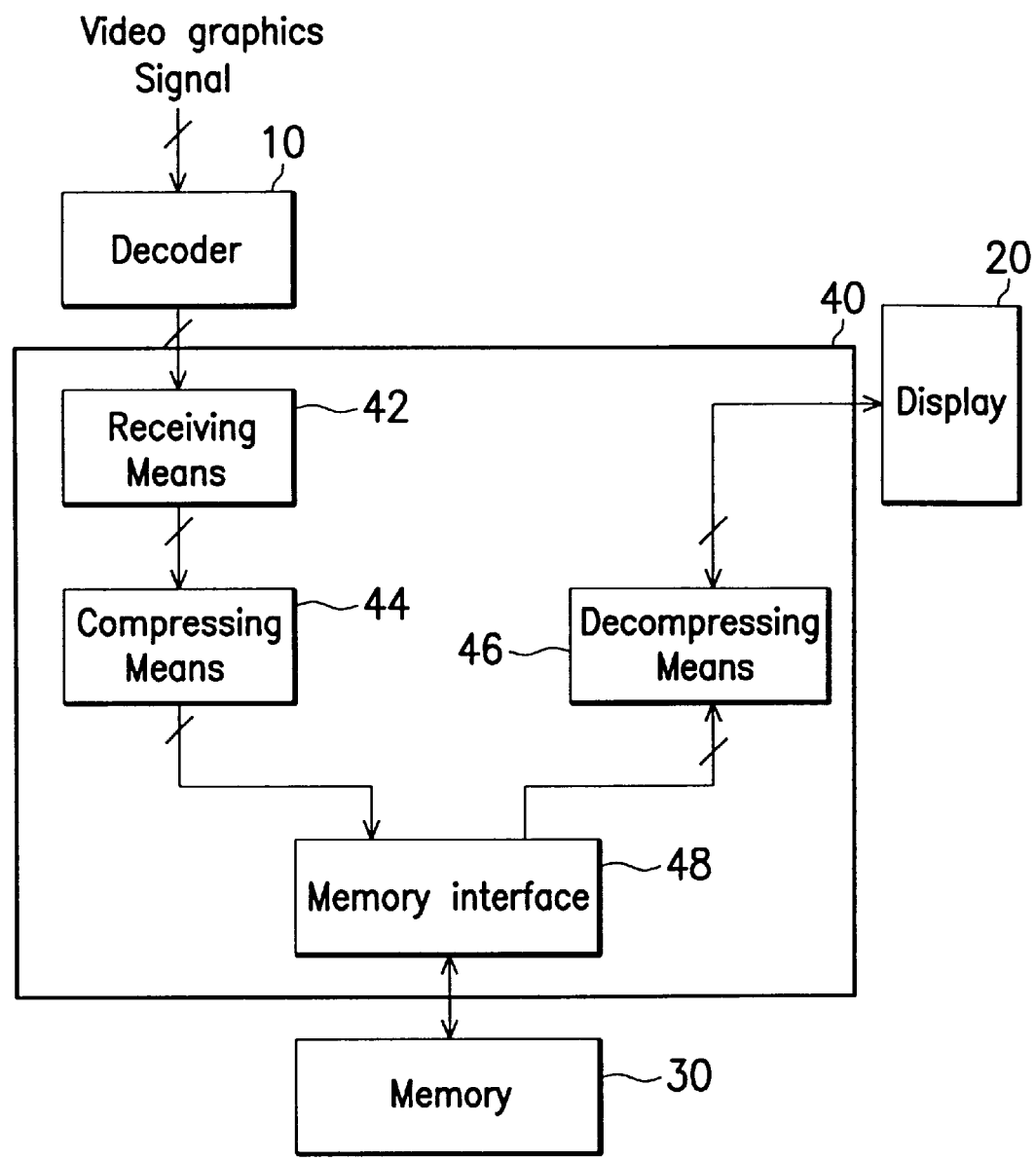
FIG. 1 is a structural diagram of a video system applying the compressing/decompressing apparatus according to the present invention.

FIG. 1 is a structural diagram of a video system applying the compressing/decompressing apparatus according to the present invention, wherein the video system comprises a decoder 10, a display 20, a frame buffer memory 30 and a compressing/decompressing apparatus 40 for compressing and decompressing a video graphics signal.

The decoder 10 is provided for receiving various kinds of formats of video graphics signals from decompressed video through either broadcasting or networking schemes, and converting the inputted video graphics signal into a video graphics signal of a format used in the video system. The compressing/decompressing apparatus 40 is provided for compressing the video graphics signal from the decoder 10 by truncating each pixel a predetermined length of LSBs, and storing the compressed graphics signal in the frame buffer memory 30 so that the memory size and the hardware cost of the video system are reduced. The compressing/decompressing apparatus 40 is also provided for decompressing the compressed video graphics signal stored in the frame buffer memory 30 by adding each compressed pixel an adjusted valued of the predetermined length, and outputting the decompressed video graphics signal to the display 20.

In most digital video systems, each pixel in the video graphics signal is stored in either YCbCr or RGB format. That is, each pixel component (Y/Cb/Cr or R/G/B) is represented as 8-bit values.

The compressing/decompressing apparatus 40 comprises receiving means 42, compressing means 44, decompressing means 46 and a memory interface 48, and is provided for receiving the video graphics signal, compressing the video graphics signal to obtain a compressed video graphics signal storing in the frame buffer memory 30 of a smaller size, reading the compressed video graphics signal from the frame buffer memory 30, decompressing the compressed video graphics signal through a predicting process to obtain the decompressed video graphics signal, and outputting the decompressed video graphics signal to the display 20.

In the compressing/decompressing apparatus 40 according to the present invention, since each pixel of the video graphics signal is truncated a predetermined length LSBs, the frame buffer memory 30 required in the video system can be effectively reduced. At the same time, since the compressed video graphics signal is decompressed through a predicting process, which uses adjacent pixels having better resolution, the quality and video resolution of the outputted images can be preserved.

The operation of the compressing/decompressing apparatus 40 is described as follows.

The receiving means 42 is provided for receiving a decoded video graphics signal from decompressed video through either broadcasting or networking schemes. The received video graphics signal may be stored in YCbCr or RGB format, wherein each pixel component (Y/Cb/Cr or R/G/B) is represented as 8-bit values.

The compressing means 44 coupled to the receiving means 42 is provided for sequentially receiving a video graphics packet of the video graphics signal, truncating each pixel a predetermined length of LSBs to form a compressed video graphics packet, and storing the compressed video graphics packet in the frame buffer memory 30 through the memory interface 48.

Y component of the video graphics signal, for the sake of convenience, is now used to explain the operation of the compressing means; whereas other components are compressed by the same way.

Figure 2:
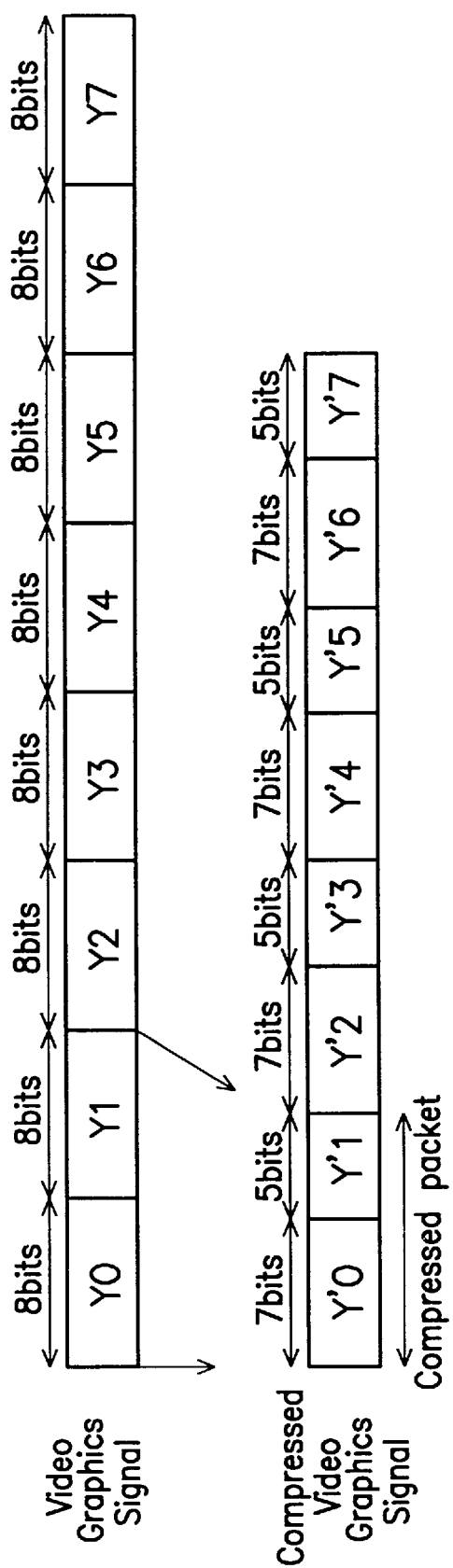
FIG. 2 is a format of the inputted video graphics signal and the compressed video graphics signal in the compressing/decompressing apparatus and method according to the present invention.

FIG. 2 is a format of the inputted video graphics signal and the compressed video graphics signal in the compressing/decompressing apparatus and method according to the present invention. The video graphics signal comprises a sequence of pixels each representing a 8-bit value, such as Y0, Y1, Y2, Y3, Y4, Y5, Y6, Y7 in FIG. 2. The compressing means 44 then sequentially receives a video graphics packet, which is comprised of two contiguous pixels (for example, Y0 and Y1), and truncates one LSB of the first pixel (for example, Y0) and three LSBs of the second pixel (for example, Y1) to obtain a compressed video graphics packet, which is comprised of two compressed pixels (for example, Y0' and Y1').

In this embodiment, since the compressing method converts each component of two adjacent pixels (with original 16 bits) into a 12-bit packet, which comprises 7 MSBs of the first pixel and 5 MSBs of the second pixel, the compressing method can result in a 4:3 compression of the original image. In addition, since the compressing method truncates the first pixel and the second pixel with different length, the video resolution in different positions can be compensated, and the decompressed video graphics signal can be recovered by reference of adjacent pixels having higher resolution.

The decompressing means 46 coupled to the memory interface 48 is provided for sequentially receiving the compressed video graphics packet, restoring each pixel with an adjusted of the predetermined length through a predicting process to form the decompressed video graphics signal, and outputting the decompressed video graphics signal to the display 20 through the memory interface 48.

Figure 3:
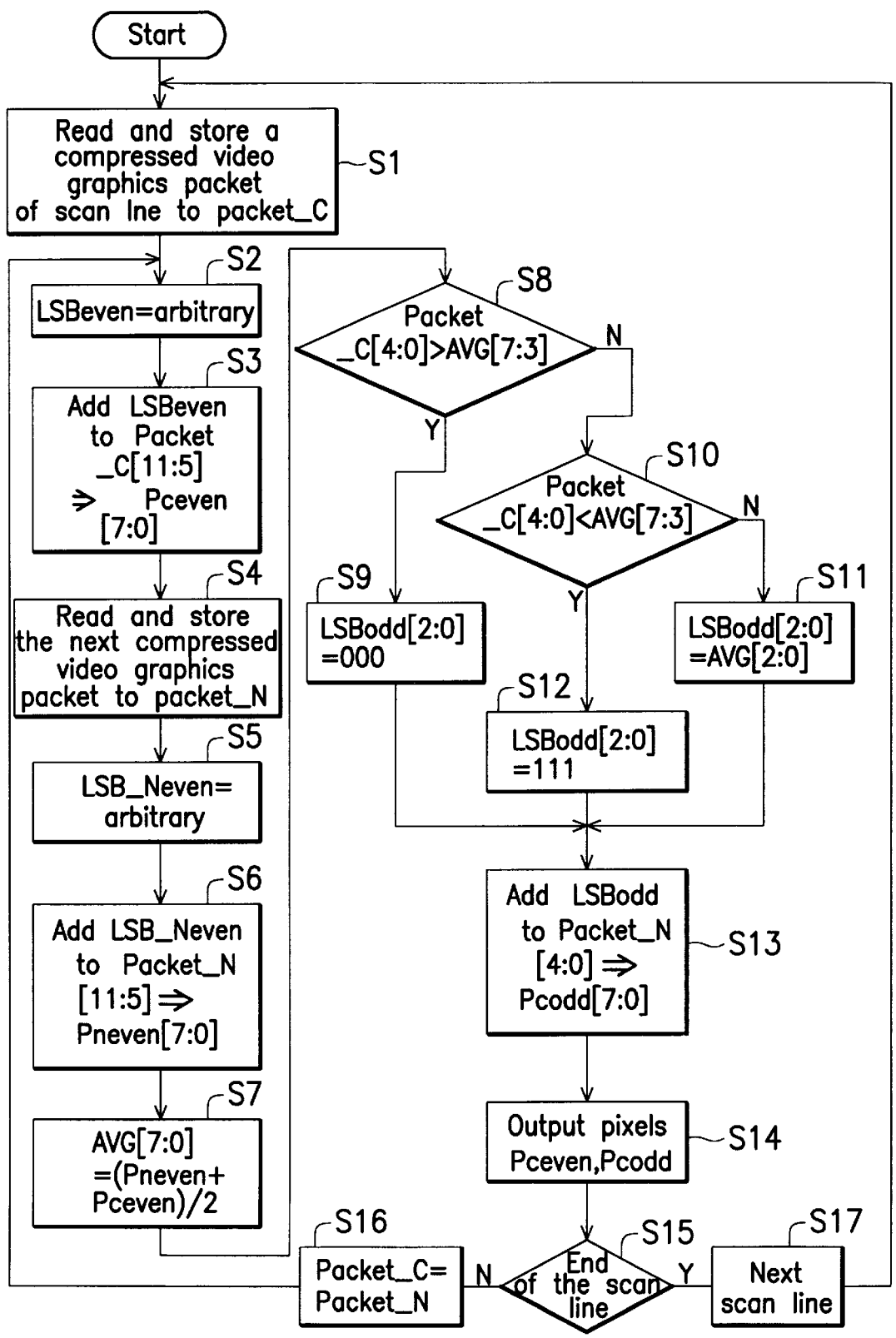
FIG. 3 is a flow chart showing the operation of the decompressing means in the compressing/decompressing method according to the present invention.

FIG. 3 is a flow chart showing the operation of the decompressing means in the compressing/decompressing method according to the present invention.

At first, a first compressed video graphics packet of the first compressed graphics signal is read and stored in the register PACKET_C in step S1. The first compressed video graphics packet is 12 bits long and is comprised of a first compressed pixel of 7 bits and a second compressed pixel of 5 bits.

Then, a bit LSBeven of random value is obtained in step S2 and added to the end of the first pixel in the first compressed video graphics packet (that is, the end of the first 7 bits in register PACKET_C[11:5]) in step S3 to obtain the first decompressed pixel corresponding to the first compressed pixel Pceven[7:0].

A second compressed video graphics packet next to the first compressed video graphics packet stored in the frame buffer memory 30 (that is, the next two compressed pixels, the third compressed pixel and the fourth compressed pixel, of the first compressed pixel and the second compressed pixel) are then read and stored in another register PACKET_N of 12 bits in step S4.

And a bit LSBeven of random value is obtained in step S5 and added to the end of the third compressed pixel of the second compressed graphics packet (that is, the first 7 bits of the register PACKET_N[11:5]) in step S6 to obtain the third decompressed corresponding to the third compressed pixel Pneven[7:0].

The first decompressed pixel Pceven[7:0] and the third decompressed pixel Pneven[7:0] are then averaged in step 7 to obtain AVG[7:0].

Comparing 5 MSBs of AVG[7:3] (that is, AVG[7:3]) with the second compressed pixel (that is, the last 5 bits of the register PACKET_C[4:0]) in step S8 and S10.

In this embodiment, if AVG[7:3] is larger than the second compressed pixel (that is, the register PACKET_C[4:0]), the value of the second compressed pixel is smaller and a LSBodd of 3 bits is provided as 111 in step S9 to be added to the end of the second compressed pixel to form the second decompressed pixel Pcodd[7:0] in step S13.

If AVG[7:3] is smaller than the second compressed pixel (that is, the register PACKET_C[4:0]), the value of the second compressed pixel is larger and a LSBodd of 3 bits is provided as 000 in step S12 to be added to the end of the second compressed pixel to form the second decompressed pixel Pcodd[7:0] in step S13.

Besides, if AVG[7:3] is equal to the second compressed pixel (that is, the register PACKET_C[4:0]), LSBodd of 3 bits is provided as 3 LSBs of AVG[7:0] (that is, the register AVG[2:0]) in step S11 to be added to the end of the second compressed pixel to form the second decompressed pixel Pcodd[7:0] in step S13.

Then, the first decompressed pixel Pceven[7:0] and the second decompressed pixel Pcodd[7:0] are outputted together as a first decompressed video graphics packet in step S14.

Then, the end of the scan line is detected in step S15 to proceed the next scan line in step S16 and S17, and a decompressed video graphics signal comprised of the decompressed packets as mentioned above is obtained.

Further, the decompressed video graphics signal is similar to the inputted video graphics signal in this embodiment because the decompressing method uses adjacent pixels having a higher resolution, each of which is represented by 7 bits, to predict and compensate the pixels having lower resolution, which are each represented by 5 bits. Besides, the compressed packet obtained by non-uniformly truncating one LSB and three LSBs of different pixels also can make the compressing method mentioned above possible and result in outputted images having a better resolution while keeping the memory size small.

Figure 4:
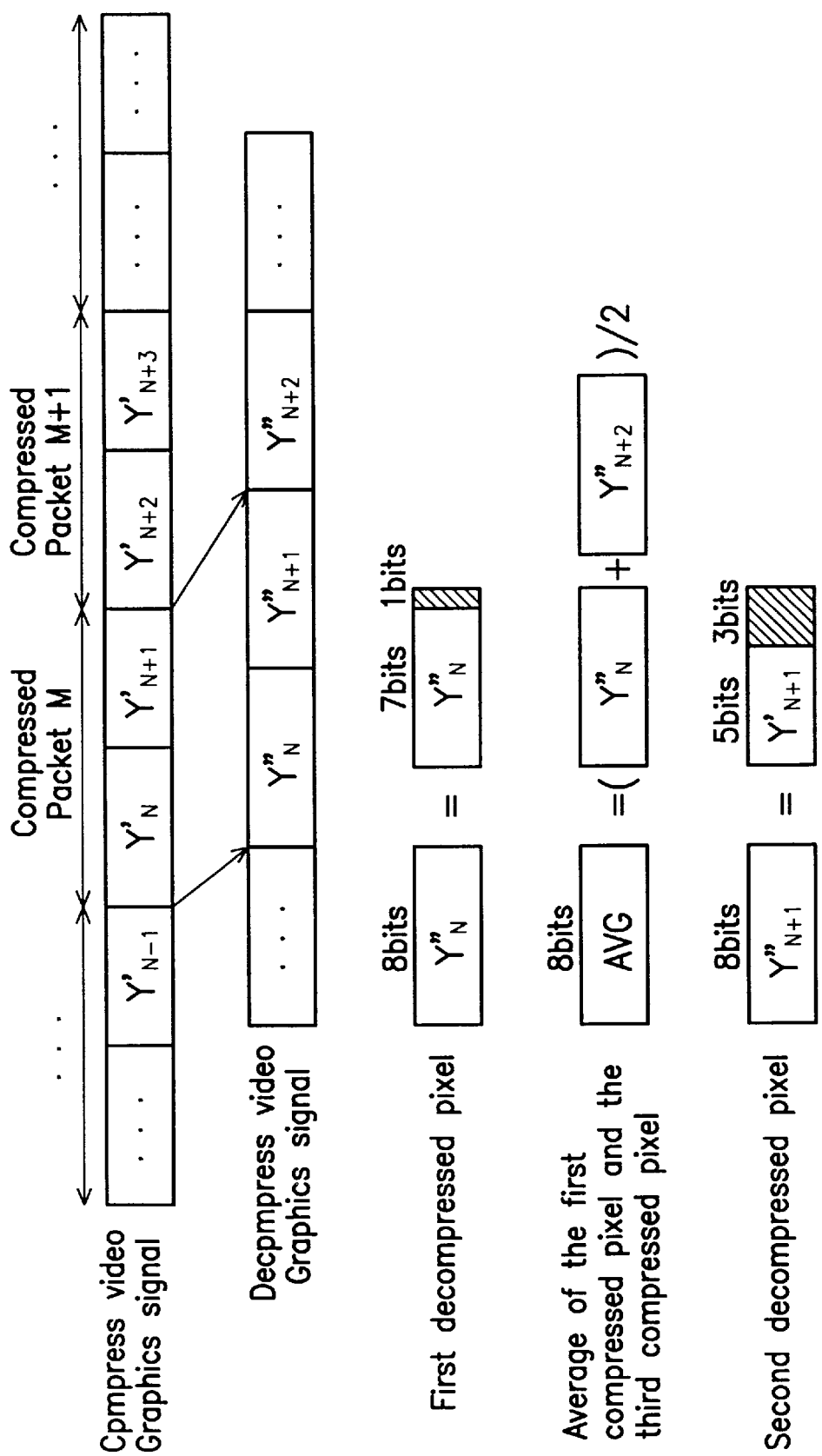
FIG. 4 is a format of the compressed video graphics signal and the decompressed video graphics signal in the compressing/decompressing apparatus and method according to the present invention.

FIG. 4 is a format of the compressed video graphics signal and the decompressed video graphics signal in the compressing/decompressing apparatus and method according to the present invention.

Wherein, the decompressed video graphics signal is comprised of the decompressed video graphics packets obtained as mentioned above. A compressed video graphics packet M comprises compressed pixels $Y'_N$ and $Y'_{N+1}$. A compressed video graphics packet M+1 next to the compressed video graphics packet M comprises compressed pixels $Y'_{N+2}$ and $Y'_{N+3}$. Besides, the decompressed pixel $Y-_N$ is obtained by adding a bit of random value to the compressed pixel $Y'_N$. The decompressed pixel $Y''_{N+1}$ is obtained by adding an adjusted value of 3 bits to the compressed pixel $Y'_{N+1}$ by comparing the pixel $Y'_N$ and the pixel $Y'_{N+2}$.

Second Embodiment

In the compressing/decompressing apparatus and method of the present invention, each video graphics packet can further comprises three, four or more pixels rather than two pixels only. As long as the compressing means truncates each pixel of the video graphics packet non-uniformly (so a pixel of lower resolution is surrounded by pixels of higher resolution), and the decompressing means recovers each pixel through a predicting process, the quality and video resolution can be maintained while the size of the frame buffer memory in the video systems be reduced.

To sum up, the compressing/decompressing apparatus and method of the present invention not only can reduce the memory size, but also keep the quality better than that of other video systems with the same memory size.

The foregoing description of a preferred embodiment of the present invention has been provided for the purposes of illustration and description only. It is not intended to be exhaustive or to limit the invention to the precise forms disclosed. Many modifications and variations will be apparent to practitioners skilled in this art. The embodiment was chosen and described to best explain the principles of the present invention and its practical application, thereby enables those who are skilled in the art to understand the invention for various embodiments and with various modifications as are suited to the particular use contemplated. It is intended that the scope of the invention be defined by the following claims and their equivalents.

What is claimed is:

1. A compressing/decompressing apparatus having a frame buffer memory and a display for compressing and decompressing a video graphics signal, comprising:

a receiver for receiving said video graphics signal comprising a plurality of video graphics packets, wherein each video graphics packet comprises a plurality of pixels;

a memory interface coupled between the frame buffer memory and a compressor and a decompressor;

said compressor coupled to said receiver for sequentially receiving a video graphics packet of said video graphics signal, truncating each pixel in said video graphics packet by a predetermined number of LSBs to form a compressed video graphics signal comprising a plurality of such compressed video graphics packets, and storing said compressed video graphics signal in said frame buffer memory through said memory interface; and said decompressor, coupled to said memory interface, for sequentially receiving a compressed video graphics packet of said compressed signal, recovering each pixel of said compressed video graphics packet with an adjusted value of said predetermined number of LSBs to form a decompressed video graphics signal comprising a plurality of such decompressed video graphics packets, and outputting said decompressed video graphics signal to said display through said memory interface;

wherein said video graphics packet comprises a first pixel and a second pixel, and said compressed video graphics packet is formed by truncating said first pixel by a first number of LSBs and truncating said second pixel by a different second number of LSBs.

2. The compressing/decompressing apparatus as claimed in claim 1, wherein said video graphics signal is a RGB graphics signal in which R-signal, G-signal and B-signal are each represented by 8 bits.

3. The compressing/decompressing apparatus as claimed in claim 1, wherein said video graphics signal is a YCbCr graphics signal in which Y-signal, Cb-signal and Cr-signal are each represented by 8 bits.

4. The compressing/decompressing apparatus as claimed in claim 1, wherein a first compressed pixel is represented by 7 bits, a second compressed pixel is represented by 5 bits, and a third compressed pixel is represented by 7 bits.

5. The compressing/decompressing apparatus as claimed in claim 1, wherein said compressed video graphics packet is formed by truncating one LSB of a first pixel and three LSBs of a second pixel in said video graphics packet.

6. The compressing/decompressing apparatus as claimed in claim 4, wherein said first and said second compressed pixels are in said compressed video graphics packet, and said third compressed pixel is in a next compressed video graphics packet, and wherein adjusted values are provided by a predictor, and said predictor is provided for:

reading said first compressed pixel and said second compressed pixel in said compressed video graphics packet;

recovering said first compressed pixel with one bit of random value to form a first decompressed pixel;

reading said third compressed pixel in a next compressed video graphics packet of said compressed video graphics signal;

comparing said second compressed pixel and a mean value of said first compressed pixel and said third compressed pixel to form a difference signal; and recovering said second compressed pixel with three bits of said adjusted value according to said difference signal to form a second decompressed pixel.

7. The compressing/decompressing apparatus as claimed in claim 6, wherein said adjusted value is 000 when said second compressed pixel is larger than said mean value of said first compressed pixel and said third compressed pixel.

8. The compressing/decompressing apparatus as claimed in claim 6, wherein said adjusted value is 111 when said second compressed pixel is smaller than said mean value of said first compressed pixel and said third compressed pixel.

9. The compressing/decompressing apparatus as claimed in claim 6, wherein said adjusted value is three LSBs of said mean value of said first compressed pixel and said third compressed pixel when said second compressed pixel is equal to said mean value of said first compressed pixel and said third compressed pixel.

10. A compressing/decompressing method used in a video system having a frame buffer memory and a display, for compressing and decompressing a video graphics signal, said compressing/decompressing method comprising:

receiving said video graphics signal comprising a plurality of video graphics packets, wherein each video graphics packet comprises a plurality of pixels;

providing a data transfer interface by coupling a memory interface between the frame buffer memory and a compressor and between the frame buffer memory and a decompressor;

coupling said compressor to a receiver for sequentially receiving a video graphics packet of said video graphics signal, truncating a predetermined length of LSBs of each pixel in said video graphics packet to form a compressed video graphics signal comprising a plurality of such compressed video graphics packets, and storing said compressed video graphics signal in said frame buffer memory through said memory interface; and coupling said decompressor to said memory interface for sequentially receiving a compressed video graphics packet of said compressed video graphics signal, recovering each pixel of said compressed video graphics packet with a predicted value of said predetermined length of LSBs to form a decompressed video graphics signal comprising a plurality of decompressed video graphics packets, and outputting said decompressed video graphics signal to said display through said memory interface, wherein said video graphics packet comprises a first pixel and a second pixel, and said compressed video graphics packet is formed by truncating a first length of LSBs of said first pixel and a second length of LSBs of said second pixel in said video graphics packet.

11. The compressing/decompressing method as claimed in claim 10, wherein said video graphics signal is a RGB graphics signal in which R-signal, G-signal and B-signal are each represented by 8 bits.

12. The compressing/decompressing method as claimed in claim 10, wherein said video graphics signal is a YCbCr graphics signal in which Y-signal, Cb-signal and Cr-signal are each represented by 8 bits.

13. The compressing/decompressing method as claimed in claim 10, wherein said compressed video graphics packet is formed by truncating one LSB of a first pixel and three LSBs of a second pixel in said video graphics packet.

14. The compressing/decompressing method as claimed in claim 10, wherein a first compressed pixel is represented by 7 bits, a second compressed pixel is represented by 5 bits, and a third compressed pixel is represented by 7 bits.

15. The compressing/decompressing method as claimed in claim 14, wherein said predicted values are provided by a predictor, and said predictor is provided for:

reading said first compressed pixel and said second compressed pixel which are both in said compressed video graphics packet;

recovering said first compressed pixel with one bit of random value to form a first decompressed pixel;

reading said third compressed pixel in a next compressed packet of said compressed video graphics signal; and comparing said second compressed pixel and a mean value of said first compressed pixel and said third compressed pixel to form a difference signal, and recovering said second compressed pixel with three bits of said predicted value according to said difference signal to form a second decompressed pixel.

16. The compressing/decompressing method as claimed in claim 15, wherein said adjusted value is 000 when said second compressed pixel is larger than said mean value of said first compressed pixel and said third compressed pixel.

17. The compressing/decompressing method as claimed in claim 15, wherein said adjusted value is 111 when said second compressed pixel is smaller than said mean value of said first compressed pixel and said third compressed pixel.

18. The compressing/decompressing method as claimed in claim 15, wherein said adjusted value is three LSBs of said mean value of said first compressed pixel and said third compressed pixel when said second compressed pixel is equal to said mean value of said first compressed pixel and said third compressed pixel.

* * * * *